(12) United States Patent
Youssef

(10) Patent No.: US 7,142,024 B2
(45) Date of Patent: Nov. 28, 2006

(54) POWER ON RESET CIRCUIT

(75) Inventor: Tom Youssef, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 44 days.

(21) Appl. No.: 10/978,852

(22) Filed: Nov. 1, 2004

(65) Prior Publication Data

US 2006/0091920 A1    May 4, 2006

(51) Int. Cl.
*H03L 7/00* (2006.01)

(52) U.S. Cl. .................... 327/143; 327/198

(58) Field of Classification Search ........... 327/142, 327/143, 198
See application file for complete search history.

(56) References Cited

U.S. PATENT DOCUMENTS

| | | | | |
|---|---|---|---|---|
| 4,970,408 A | * | 11/1990 | Hanke et al. | 327/143 |
| 5,115,146 A | * | 5/1992 | McClure | 327/143 |
| 5,149,987 A | * | 9/1992 | Martin | 327/143 |
| 5,528,184 A | * | 6/1996 | Gola et al. | 327/198 |
| 5,825,220 A | * | 10/1998 | Kinugasa et al. | 327/143 |
| 6,144,237 A | * | 11/2000 | Ikezaki | 327/143 |
| 6,157,227 A | * | 12/2000 | Giovinazzi et al. | 327/143 |
| 6,469,551 B1 | * | 10/2002 | Kobayashi et al. | 327/143 |
| 6,870,408 B1 | * | 3/2005 | Kim | 327/143 |
| 2003/0174002 A1 | * | 9/2003 | Slamowitz et al. | 327/143 |
| 2004/0041602 A1 | * | 3/2004 | Kawakubo | 327/143 |

* cited by examiner

*Primary Examiner*—Linh My Nguyen
*Assistant Examiner*—Thomas J. Hiltunen
(74) *Attorney, Agent, or Firm*—Lisa K. Jorgenson; Andre M. Szuwalski

(57) ABSTRACT

A power on reset circuit includes a pulse generation circuit that is connected to receive a supply voltage and respond to an initial ramp-up of that supply voltage to generate an output pulse that transitions from a low to a relatively high state tracking the supply voltage ramp-up. The pulse generation circuit further sets a feedback node in an enable state. Responsive to a flip signal received at an input node, the pulse generation circuit then transitions the output pulse from the relatively high state to the low state and sets the feedback node in a disable state. A static current control transistor switch includes a source-drain circuit coupled to the supply voltage and further includes a gate. The gate is connected to the feedback node such that the transistor switch is actuated in response to the feedback node enable state and unactuated in response to the feedback node disable state. A resistive divider circuit, including at least two resistors connected in series with each other at a tap, is connected in series with the source-drain circuit of the static current control transistor. The tap of the resistive divides circuit is connected to the input node of the pulse generation circuit to supply the flip signal.

18 Claims, 4 Drawing Sheets

POWER ON RESET CIRCUIT

BACKGROUND OF THE INVENTION

1. Technical Field of the Invention

The present invention relates to power on reset circuits or other circuits configured to generate a one-shot pulse

2. Description of Related Art

Reference is now made to FIG. 1 wherein there is shown a schematic diagram of a prior art power on reset circuit 100. At the heart of the circuit 100 is a latch 102 formed by transistors Q1–Q4. More specifically, p-channel transistors Q1 and Q2 are connected in a cross-coupled relationship wherein the gate of one transistor is connected to the drain of the other transistor. The sources of transistors Q1 and Q2 are connected to Vdd. The gate of transistor Q1 is further connected to Vdd through a capacitor C1, and the gate of transistor Q2 is further connected to ground (GND) through a capacitor C2. The latch 102 further includes a pair of n-channel transistors Q3 and Q4. The drain of transistor Q3 is connected to the drain of transistor Q1 at a first latched node 104 of the latch 102, while the source of transistor Q3 is connected to ground. The drain of transistor Q4 is connected to the drain of transistor Q2 at a second latched node 106 of the latch 102, while the source of transistor Q4 is connected to ground. The gates of transistors Q1 and Q3 are connected together and to the second latched node 106. The gates of transistors Q2 and Q4 are connected together and to the first latched node 104.

The circuit 100 further includes a p-channel transistor Q5 and an n-channel transistor Q6 source-drain connected in series between Vdd and ground. The gate of transistor Q5 is connected to a feedback node 120 and is further connected to Vdd through a capacitor C3, while the gate of transistor Q6 is connected to Vdd The connected drains of transistors Q5 and Q6 are connected at an input node 122 to the gate of n-channel transistor Q7 and are further connected to ground through a capacitor C4. The source of transistor Q7 is connected to ground, and the drain of transistor Q7 is connected to the second latched node 106 within latch 102.

The first latched node 104 of the latch 102 is connected to the input of a first CMOS inverter 108, and the output of the first CMOS inverter 108 is connected to the input of a second CMOS inverter 110. The output of the second CMOS inverter 110 is connected to Vdd through a capacitor C5 and is further connected to the input of a third CMOS inverter 112. The output of the third CMOS inverter 112 is connected to the input of a fourth CMOS inverter 114. The output of the fourth CMOS inverter 114 is connected at feedback node 120 to the gate of transistor Q5 and is further connected to the input of a fifth CMOS inverter 116, whose output provides the power on reset (POR) signal.

The circuit 100 further includes n-channel transistors Q8–Q10. The transistor Q8 is source-drain connected between latched node 104 and Vdd. The gate of transistor Q8 is connected to ground through a capacitor C6, and is connected to both the gate and drain of transistor Q9 and also to the source of transistor Q10. The source of transistor Q9 and the gate and drain of transistor Q10 are connected to Vdd.

The circuit of FIG. 1 is used to generate a single pulse at power on of Vdd. This single pulse can be used in many applications including initializing latches, nodes and kick starting oscillator circuits.

Reference is now additionally made to FIG. 3 wherein there is shown a waveform trace illustrating operation of the circuit of FIG. 1. As Vdd ramps up and exceeds the Vtp level of the latch 102, the latched nodes 104 and 106 assume a certain state relationship. For example, the transistors Q1–Q4 can be dimensioned in such a way as to set latched node 104 low and latched node 106 high as the circuit begins to power up. With latched node 106 high and latched node 104 low, the set of CMOS inverters 108–114 will set feedback node 120 low and thus turn on transistor Q5. Through the CMOS inverter 116, the POR output signal will go high (as shown at reference 130 in FIG. 3). Transistor Q5, which is now on, then fights against turned on transistor Q6 to pull input node 122 high and charge the capacitor C4. When input node 122 then exceeds Vtn as it goes high (following an RC time constant induced delay), transistor Q7 turns on and drags latched node 106 from the high towards the low state. This causes latch 102 to trip and drive latched node 106 low and send latched node 104 high. With latched node 106 low and latched node 104 high, the set of CMOS inverters 108–114 will set feedback node 120 high and thus turn off transistor Q5 (and therefore cut-off the static current flowing through transistors Q5 and Q6 to minimize power drain). Through the CMOS inverter 116, the POR output signal will then go low (as shown at reference 132 in FIG. 3). Input node 122 then returns low and turns off transistor Q7 thus preserving the latched states of the latch 102.

Some companion circuits used with the circuit 100, such as, for example, a low current oscillator, require that the POR signal transition from high to low at about Vdd=1.2 V for the worst case condition (considering process and temperature variation). It is recognized by those skilled in the art that the Vdd voltage level transition point for the POR signal from high to low (reference 132) is dependent on the ratio of transistors Q5 and Q6. In a common application of the circuit 100 of FIG. 1, the ramped-up Vdd voltage level is typically 3.3 V or 5.0 V. Since Vdd has to power up to a minimum of 3.0 V in these technologies, the window to generate the transition of the POR signal (at the trip point, reference 132) by properly setting the ratio of transistors Q5 and Q6 is quite wide. For example, the trip point could be relatively easily set through proper ratio setting anywhere from 1.2 V to 2.9 V.

A problem, however, arises when the circuit of FIG. 1 is considered for use in a technology wherein Vtn or Vtp voltages are less than 0.5 V and the ramped-up Vdd voltage level is 1.3 V. Operation of the circuit 100 with a ramped-up Vdd voltage of 1.3 V is specifically illustrated in FIG. 3. The window to generate the trip point in this scenario is very tight with respect to Vdd, and more specifically is from the Vtp voltage level to 1.2 V. With the circuit of FIG. 1, however, and given consideration to all process corners and temperature ranges (for example, −40 to +125 degrees Centigrade), it is not possible to generate at trip point (reference 132) at greater than a ramping-up Vdd voltage level of about 0.64 V (which is Vtp plus 150 mV when Vdd is ramped-up to 1.3 V due to transistor voltage linearity). If the companion circuit, such as a low current oscillator, requires that the POR signal transition from high to low at a greater voltage level than 0.64 V, say about Vdd=1.2 V for the worst case condition to kick start the oscillator, then the circuit of FIG. 1 cannot be used.

A need accordingly exists for a POR circuit that solves the foregoing problem. A need also exists for a POR circuit that is suitable for operation with technologies using a ramped-up Vdd voltage of about 1.3 V, and further is capable of having a POR signal trip point from high to low be settable (perhaps selectable) and in particular be capable of being set to about 1.2 V.

SUMMARY OF THE INVENTION

In accordance with one embodiment, a one shot pulse signal generator comprises a pulse signal generation circuit including an input node receiving a flip signal and an output node from which a pulse signal is generated. A flip signal generation circuit, including a resistive divider circuit comprised of at least two resistors connected in series with each other at a tap, is provided with the tap being connected to the input node of the pulse generation circuit to supply the flip signal. The pulse generation circuit responds to the flip signal by flipping a state of the output node generated pulse signal from high to low.

In accordance with another embodiment, a power on reset circuit comprises a pulse generation circuit including an input node, a static current control feedback node and an output node from which a pulse signal is generated. The circuit further includes a static current control transistor switch, including a source-drain circuit and a gate, with the gate being connected to the static current control feedback node. A resistive divider circuit, including at least two resistors connected in series with each other at a tap, is connected in series with the source-drain circuit of the static current control transistor. The tap is connected to the input node of the pulse generation circuit.

In accordance with yet another embodiment, a power on reset circuit includes a pulse generation circuit that is connected to receive a supply voltage and respond to an initial ramp-up of that supply voltage to generate an output pulse that transitions from a low to a relatively high state tracking the supply voltage ramp-up. The pulse generation circuit further sets a feedback node in an enable state. Responsive to a flip signal received at an input node, the pulse generation circuit then transitions the output pulse from the relatively high state to the low state and sets the feedback node in a disable state. A static current control transistor switch includes a source-drain circuit coupled to the supply voltage and further includes a gate. The gate is connected to the feedback node such that the transistor switch is actuated in response to the feedback node enable state and unactuated in response to the feedback node disable state. A resistive divider circuit, including at least two resistors connected in series with each other at a tap, is connected in series with the source-drain circuit of the static current control transistor. The tap of the resistive divides circuit is connected to the input node of the pulse generation circuit to supply the flip signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
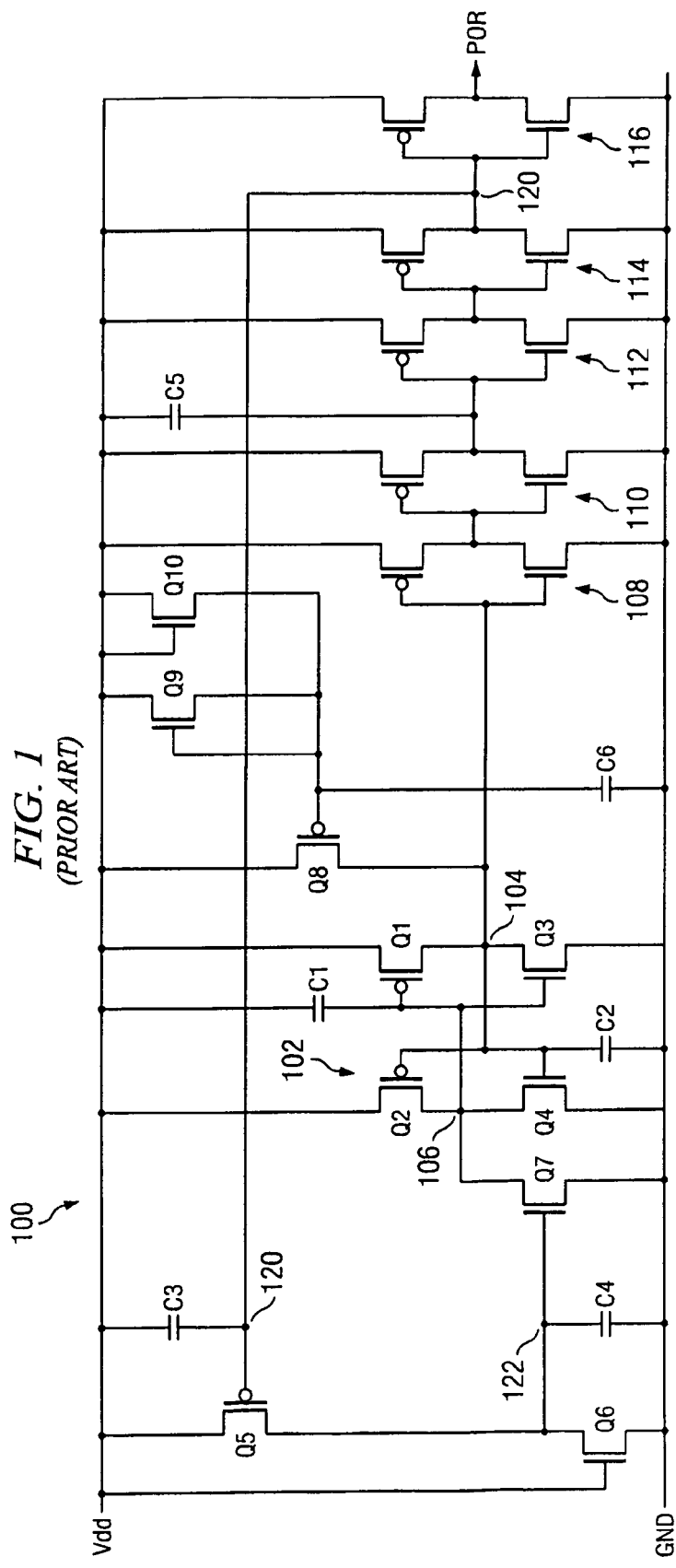
FIG. 1 is a schematic diagram of a prior art power on reset circuit.
Figure 2:
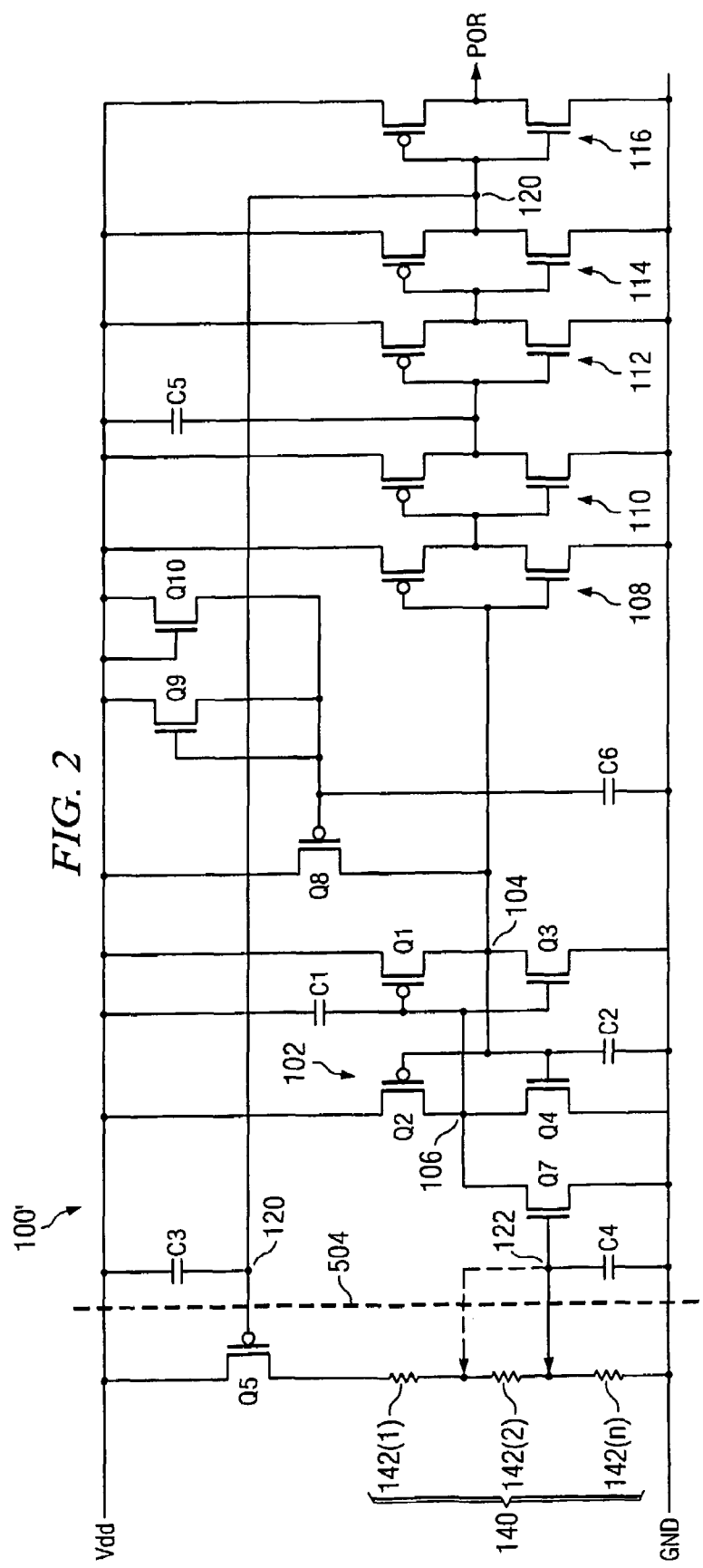
FIG. 2 is a schematic diagram of a power on reset circuit in accordance with an embodiment of the present invention.

Reference is now made to FIG. 2 wherein there is shown a schematic diagram of a power on reset circuit 100' in accordance with an embodiment of the present invention. Like reference numbers and component designations in FIG. 2 refer to like and/or similar components in FIG. 1 and previously described herein. The description of such components is accordingly incorporated by reference and will not be repeated. Instead, the following discussion will focus on differences (both structural and operational) between the circuits 100 and 100' of FIGS. 1 and 2, respectively.

The circuit 100' of FIG. 2 differs from the circuit 100 of FIG. 1 in that the transistor Q6 has been removed and replaced with a resistive divider circuit 140. This resistive divider circuit 140 is comprised of a plurality of series connected resistors 142(1)–142(n). The input node 122 is connected to a selected one of the series connection nodes 144 (also referred to herein as "taps") in the circuit 140 where two of the included resistors 142 are connected in series with each other so as to receive a generated flip control signal.

As few as two (n=2) resistors 142 may be used in implementing the circuit 100' and achieving its benefits. Conversely, many (for example, 8–12) resistors 142 may be included in the resistive divider circuit 140 if desired. An example of such a multiple resistor 142 circuit 140 is provided in FIG. 5. The advantage of using many (n>2) series connected resistors 142 in the circuit 140 is that the input node 122 can be selectively connected to tap at any one of the corresponding plural series connection nodes 144 and thus effectuate a change in voltage which is applied to the gate of transistor Q7 and the charge time for the capacitor C4. Such modifications in the applied gate voltage and capacitor charge time cause a corresponding change in the voltage location of the trip point as Vdd is ramped-up to its maximum level.

Figure 3:
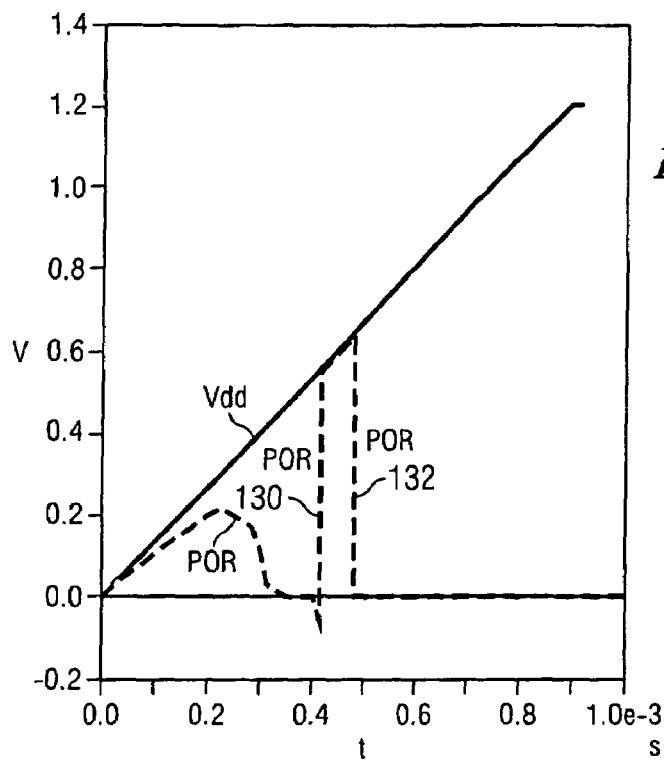
FIG. 3 is a waveform trace illustrating operation of the circuit of FIG. 1.
Figure 4:
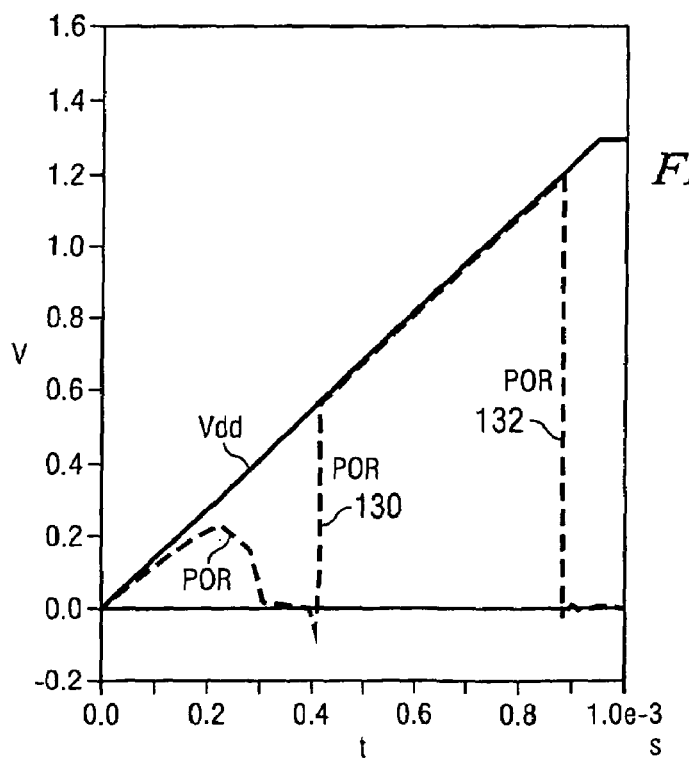
FIG. 4 is a waveform trace illustrating operation of the circuit of FIG. 2.

The resistors 142 included within the resistive divider circuit 140 provide circuit 100' with a much better voltage linearity operation than with the transistor ratio control technique provided through transistors Q5 and Q6 of FIG. 1. By properly choosing the values of the included resistors 142 (and/or the location of the input node 122 tap on the circuit 140), the trip point can be set at any particular chosen voltage level from Vtp to (Vdd −0.1 V). FIG. 4 shows a waveform trace illustrating operation of the circuit of FIG. 2, and in particular shows operation in an implementation of the circuit 100', with a ramped-up Vdd voltage of 1.3 V (like in FIG. 3) and wherein the resistors 142 (and tap location) for the resistive divider circuit 140 have been chosen to provide a POR signal trip point (reference 132) at about a ramped-up Vdd voltage of 1.2 V.

An advantage of the circuit 100' of FIG. 2 is that the trip point location is less dependent on process variation. This is because the trip point is set by the Vtn of transistor Q7 and the RC time constant of the resistive divider circuit 140 and capacitor C4.

The retention of transistor Q5 and its feedback node 120 controlled operation further ensures that the circuit 100' can achieve a desired trip point setting without worries over static current consumption. The circuit is accordingly useful in low power, for example, battery powered, circuit implementations. An example of such a low power companion circuit with which the circuit 100' may be used is a low current oscillator.

FIG. 2 further illustrates (with a dotted line) that the input node 122 tap connection into the resistive divider circuit 140 is selectively configurable. By selectively choosing which tap is connected to the input node 122, one may selectively choose the nature of the flip control signal and thus the trip point of the POR signal. This allows for the circuit 100' to be used in a number of installations where the companion circuits have differing needs for trip point voltage location.

Figure 5:
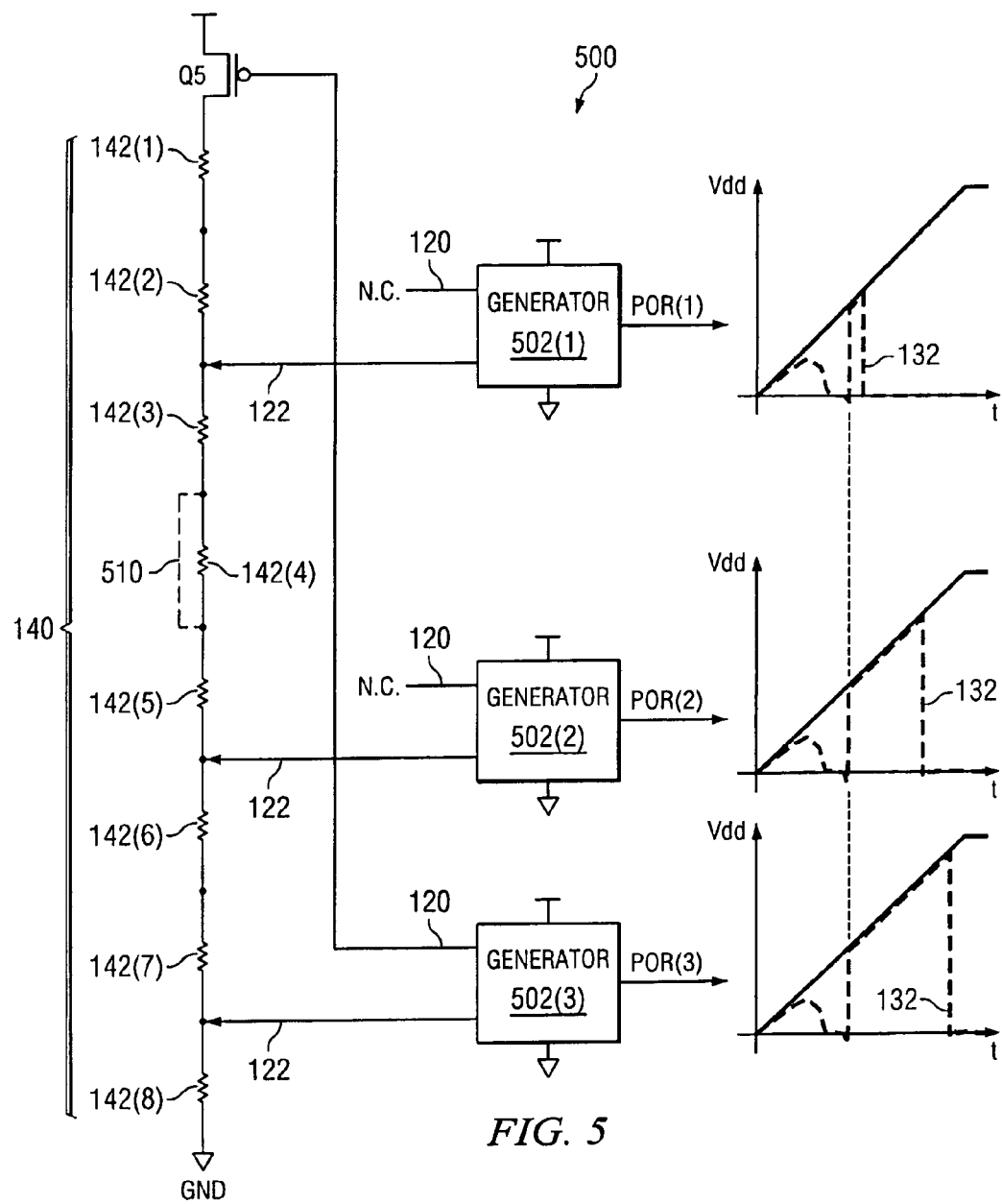
FIG. 5 is a schematic diagram of a power on reset circuit in accordance with another embodiment of the present invention.

Reference is now made to FIG. 5 wherein there is shown a schematic diagram of a power on reset circuit 500 in accordance with another embodiment of the present invention. The circuit 500 is configured with plural reset signal generators 502 and is thus capable of generating a corresponding plurality of POR signals. Each reset signal generator 502 is configured to include the circuitry, and have the configuration, of the circuit 100' shown to the right of the dotted line 504 in FIG. 2. Thus, each generator 502 includes an input node 122 and at least one of the generators includes a connection made to its feedback node 120. The plural generators 502 included in the circuit 500 share the circuitry (namely transistor Q5 and resistive divider circuit 140) to the left of the dotted line 504 in FIG. 2. More specifically, each generator has its input node 122 connected to a tap location in the resistive divider circuit 140 to receive its own flip control signal. For this configuration, the resistive divider circuit 140 would preferably include a multiplicity of series connected resistors 142 thus presenting a multiplicity of tap locations for input node 122 connection. By selectively choosing the tap location in the resistive divider circuit 140, each of the generators 502 can be configured to have a POR signal trip point (reference 132) at a different ramped-up Vdd voltage level set between Vtp and (Vdd −0.1 V). The particular one of the generators 502 with a tap location set to provide a highest trip point voltage further has its feedback node connected to the gate of transistor Q5. In this way, static current will continue to flow through the transistor Q5 and resistive divider circuit 140 and thus enable generation of a flip control signal at node 122 until the latch 102 in the generator 502 with the highest trip point voltage is tripped. At that point, the feedback node 122 would go high and turn off transistor Q5.

An advantage of the circuit of FIG. 5 is that it allows for the generation of POR signals with multiple trip points at different values without additional static current needs. This is because the transistor Q5 and resistive divider circuit 140 are shared amongst each of the included generators 502. For example, using the circuit of FIG. 5 the POR signal from generator 502(1) can be used to kick-start an oscillator in high current mode and following generation of the POR signal by generator 502(3) the oscillator will switch to a low current mode to save a battery current. It is preferred in many implementations to kick start the oscillator in high current mode and then after it starts oscillating to reduce the current to extend the life of the battery or capacitor if they are used to power the oscillator.

Adjustment of trip point voltage may also be accomplished by selectively shorting around one or more of the resistors 142 in the resistive divider circuit 140. This selective shorting operation is schematically illustrated with a dotted line connection 510 in FIG. 5. Although illustrated as shorting around just a single resistor 142, it will be understood that the connection 510 could instead be made around plural resistors 142.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A power on reset circuit, comprising:
a first pulse generation circuit including a first input node, a first static current control feedback node and a first output node from which a first pulse signal is generated;
a second pulse generation circuit including a second input node, a second static current control feedback node and a second output node from which a second pulse signal is generated;
a static current control transistor switch including a source-drain circuit and a gate, the gate connected to only one of the first or second static current control feedback nodes of the first/second pulse generation circuits; and
a resistive divider circuit including a plurality of resistors connected in series with each other at a plurality of taps, the resistive divider circuit connected in series with the source-drain circuit of the static current control transistor, and a first one of the taps connected to the first input node of the first pulse generation circuit and a second one of the taps connected to the second input node of the second pulse generation circuit.

2. The circuit of claim 1 wherein:
the first or second pulse generation circuit generates a control signal at the first or second feedback node to enable the static current control transistor in connection with pulse signal generation by either of the first or second pulse generation circuits and disable the static current control transistor at about after a last of first or second pulse signal generation.

3. The circuit of claim 1 wherein:
the first or second input node of the first or second pulse generation circuit being selectively connectable to a selected one of the taps so as to select between voltage levels for setting a trip point of the generated first or second pulse signal.

4. The circuit of claim 3 further including a shunt circuit for selectively short circuiting around a selected one or more of the resistors in the resistive divider circuit.

5. The circuit of claim 1 wherein each first or second pulse generation circuit includes a latch circuit.

6. A power on reset circuit, comprising:
a first pulse generation circuit connected to receive a supply voltage and respond to an initial ramp-up of that supply voltage to generate a first output pulse that transitions from a low to a relatively high state that tracks supply voltage ramp-up and set a first feedback node in an enable state, the first pulse generation circuit further including a first input node receiving a first flip signal and responding thereto by transitioning the first output pulse from the relatively high state to the low state and set the first feedback node in a disable state;
a second pulse generation circuit connected to receive the supply voltage and respond to the initial ramp-up of that supply voltage to generate a second output pulse that transitions from a low to a relatively high state that tracks supply voltage ramp-up and set a second feedback node in an enable state, the second pulse generation circuit further including a second input node receiving a second flip signal and responding thereto by transitioning the second output pulse from the relatively high state to the low state and set the second feedback node in a disable state;

a static current control transistor switch including a source-drain circuit coupled to the supply voltage and further including a gate, the gate connected to only one of the first or second feedback nodes, and the transistor switch being actuated in response to the connected first or second feedback node enable state and unactuated in response to the connected first or second feedback node disable state; and a resistive divider circuit including a plurality of resistors connected in series with each other at a plurality of taps, the resistive divider circuit connected in series with the source-drain circuit of the static current control transistor, and a first tap connected to the first input node of the first pulse generation circuit to supply the first flip signal, and a second tap connected to the second input node of the second pulse generation circuit to supply the second flip signal.

7. The circuit of claim 6, further including:
a capacitor connected between each first or second tap and a ground reference.

8. The circuit of claim 6, further including:
a capacitor connected between each first or second feedback node and the supply voltage.

9. The circuit of claim 6 wherein:
the first or second input node of the first or second pulse generation circuit being selectively connectable to a selected one of the taps so as to select between at least two ramping up supply voltage levels for setting a trip point of the transitioning the output pulse from the relatively high state to the low state.

10. The circuit of claim 9 further including a shunt circuit for selectively short circuiting around a selected one or more of the resistors in the resistive divider circuit.

11. The circuit of claim 6 wherein each pulse generation circuit includes a latch circuit.

12. The circuit of claim 6 wherein the only one of the first or second feedback nodes connected to the gate of the static current control transistor switch is that feedback node which is associated with the pulse generation circuit whose output pulse transitions from the relatively high state to the low state last.

13. A power on reset circuit, comprising:
a first pulse generation circuit including a first input node, a static current control feedback output and a first output node from which a first pulse signal is generated;

a second pulse generation circuit including a second input node and a second output node from which a second pulse signal is generated;

a static current control switch operable responsive to the static current control feedback output from the first pulse generation circuit; and a resistive divider circuit including a plurality of resistors connected in series with each other at a plurality of taps, the resistive divider circuit connected in series with the static current control switch, and a first one of the taps connected to the first input node of the first pulse generation circuit and a second one of the taps connected to the second input node of the second pulse generation circuit.

14. The circuit of claim 13 wherein:
the static current control feedback output generated by the first pulse generation circuit enables the static current control switch in connection with pulse signal generation by either of the first or second pulse generation circuits and disables the static current control switch at about after termination of the generated first pulse signal.

15. The circuit of claim 14 wherein:
the first tap sets the first pulse generation circuit to generate the first pulse signal with a first one shot pulse width; and
the second tap sets the second pulse generation circuit to generate the second pulse signal with a second one shot pulse width that is narrower than the first one shot pulse width.

16. The circuit of claim 13 wherein:
the first or second input node of the first or second pulse generation circuit being selectively connectable to a selected one of the taps so as to select between pulse widths of the generated first or second pulse signal.

17. The circuit of claim 16 further including a shunt circuit for selectively short circuiting around a selected one or more of the resistors in the resistive divider circuit.

18. The circuit of claim 13 wherein each first or second pulse generation circuit includes a latch circuit.

* * * * *